(12) United States Patent
Jang et al.

(10) Patent No.: US 6,239,023 B1
(45) Date of Patent: May 29, 2001

(54) METHOD TO REDUCE THE DAMAGES OF COPPER LINES

(75) Inventors: Syun-Ming Jang, Hsin-Chu; Ying-Ho Chen, Taipei; Jih-Churng Twu, Chung-Ho; Chen-Hua Yu, Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/320,757

(22) Filed: May 27, 1999

(51) Int. Cl.⁷ .................................. H01L 21/4763
(52) U.S. Cl. ...................... 438/631; 438/618; 438/651
(58) Field of Search ...................... 438/622, 623, 438/637, 638, 624, 618, 651, 653

(56) References Cited

U.S. PATENT DOCUMENTS

| | | | |
|---|---|---|---|
| 4,916,514 | 4/1990 | Nowak | 357/68 |
| 5,618,757 | 4/1997 | Bothra et al. | 438/699 |
| 5,633,190 | 5/1997 | Sugiyama | 438/404 |
| 5,639,697 | 6/1997 | Weling et al. . | |
| 5,654,245 | 8/1997 | Allen | 438/629 |
| 5,770,518 | 6/1998 | Shen | 438/631 |
| 6,060,379 * | 5/2000 | Huang et al. | 438/618 |
| 6,071,406 * | 6/2000 | Wu et al. | 438/622 |
| 6,080,663 * | 6/2000 | Chen et al. | 438/637 |
| 6,100,184 * | 8/2000 | Zhao et al. | 438/638 |

* cited by examiner

*Primary Examiner*—David Nelms
*Assistant Examiner*—Dung A Le
(74) *Attorney, Agent, or Firm*—George O. Saile; Stephen B. Ackerman

(57) ABSTRACT

The invention teaches the addition of copper lines, these copper lines to be added to isolated copper lines or to selected copper lines within a collection of copper lines. The invention also teaches the addition of copper end caps to isolated copper lines or to selected copper lines within a collection of copper lines. The invention further teaches the widening of copper lines for isolated copper lines or selected copper lines within a collection of copper lines.

9 Claims, 3 Drawing Sheets

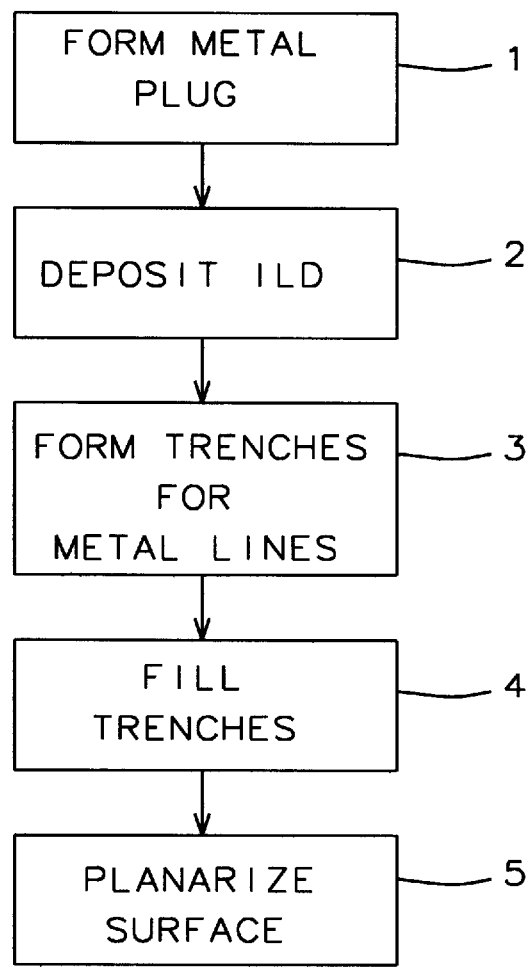
*FIG. 1a - Prior Art*
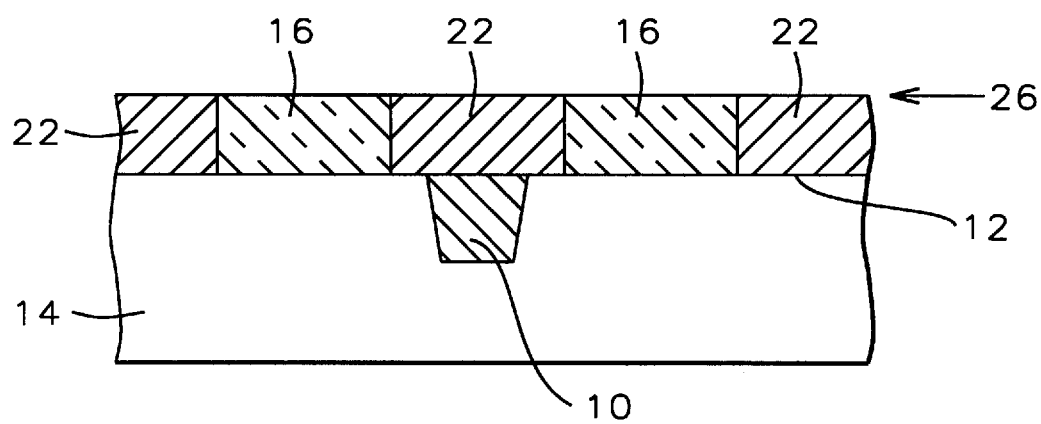
*FIG. 1b - Prior Art*

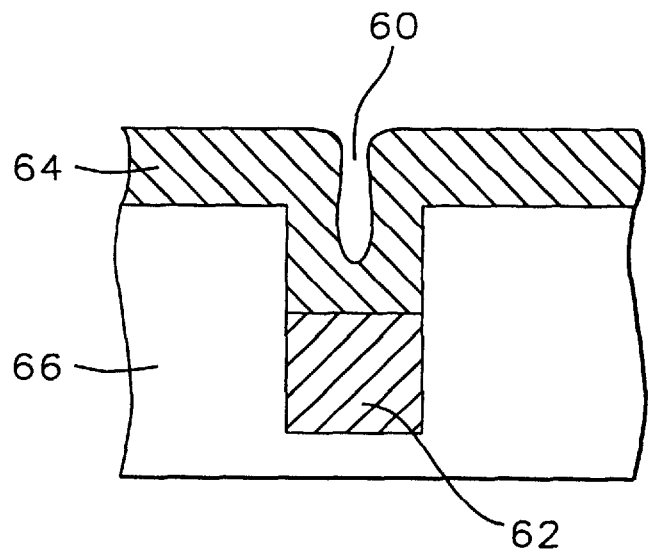
FIG. 2a - Prior Art
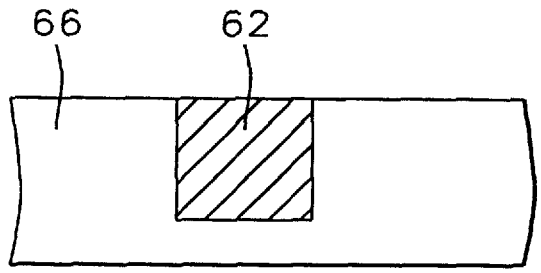
FIG. 2b - Prior Art
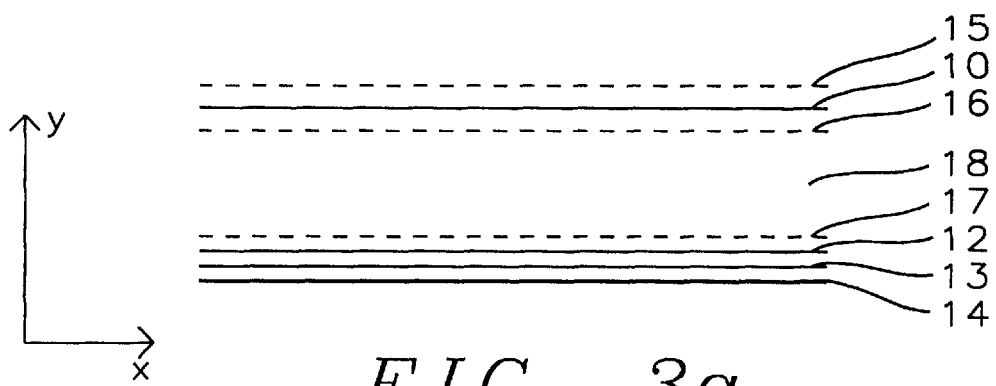
FIG. 3a

METHOD TO REDUCE THE DAMAGES OF COPPER LINES

BACKGROUND OF THE INVENTION (1) Field of the Invention

The invention belongs to the field of semiconductor manufacturing, and more specifically to the process of creating copper lines using the damascene process.

(2) Background of the Invention

The present invention relates specifically to the Damascene process that is used for the formation of semiconductor devices. Damascene derives its name from the ancient art involving inlaying metal in ceramic or wood for decorative purposes. In Very Large-Scale Integrated circuit applications, the Damascene process refers to a similar structure.

The Damascene process has been demonstrated on a number of applications. The most commonly applied process is first metal or local interconnects. Some early Damascene structures have been achieved using Reactive Ion Etching (RIE) but Chemical Mechanical Planarization (CMP) is used exclusively today. Metal interconnects using Damascene of copper and of aluminum are also being explored.

FIG. 1a gives an overview of the steps of the Damascene process, as follows:

Step 1 shows the formation of the metal plug,
step 2 shows the deposition of the Intra-Level Dielectric,
step 3 shows the formation of the trenches for metal lines,
step 4 shows the deposition of metal to fill the trenches,
step 5 shows the removal of metal from the surface.

The Damascene process is further explained below, the numbers indicated within this explanation refer to the cross section of a Damascene structure that is shown in FIG. 1b.

Referring now specifically to FIG. 1a, step 1, there is shown the formation of a metal via plug 10 within the semiconductor substrate 14 (FIG. 1b). Any micro-scratch present on the surface will fill with metal during subsequent metal deposition and can cause electrical shorts between adjacent via plugs 10 or between electrical lines deposited on top of surface 12. To remove the Damascene residue and to remove the scratch count on the surface 12, surface 12 is polished and buffed after the metal plugs 10 have been deposited.

FIG. 1a, step 2 shows the deposition of the Intra-Level Dielectric (ILD) 16 (FIG. 1b) which can be deposited using Plasma Enhanced CVD (PECVD) technology. Dielectric 16 can, for instance, be $SiO_2$.

FIG. 1a, step 3 shows the formation of the trenches 22 (FIG. 1b) for the metal lines, these trenches 22 can be formed using Reactive Ion Etching (RIE) technology.

FIG. 1a, step 4 shows the deposition of metal to fill the trenches 22, this process can use either the CVD or a metal flow process. The excess metal on the surface is removed using the CMP process, see FIG. 1a, step 5, and a planar structure 26 with metal inlays 22 in the intra-level dielectric 16 is achieved.

The application of the Damascene process continues to gain wider acceptance, most notably in the process of copper metalization due to the difficulty of copper dry etching where the Damascene plug penetrates deep in very small, sub-half micron, Ultra Large Scale integrated devices.

FIG. 2a shows Prior Art problems encountered when filling a damascene plug 62 with aluminum 64. The plug 62 can be formed in poly silicide 66. A void 60 can develop above the opening of a damascene plug 62 if the opening is relatively narrow and deep, a design characteristic that becomes more common with smaller semiconductor devices. This void 60 is caused by the difficulty experienced in having deep penetrating flow of the metal within the narrow opening. For a shallow or relatively wide plug 62, FIG. 2b, these problems are not experienced. Void 60 (FIG. 2a) also causes planarization problems during subsequent processing steps and can create a reliability issue.

Recent applications have successfully used copper as a conducting metal line, most notably in the construct of CMOS 6-layer copper metal devices. Even for these applications however, the wolfram plug was still used for contact points in order to avoid damage to the devices.

While copper has become important for the creation of multilevel interconnections, copper lines frequently show damage after CMP and clean. This in turn causes problems with planarization of subsequent layers that are deposited over the copper lines since these layers may now be deposited on a surface of poor planarity. Isolated copper lines or copper lines that are adjacent to open fields are susceptible to damage. While the root causes for these damages are at this time not clearly understood, poor copper gap fill together with subsequent problems of etching and planarization are suspected. Where over-polish is required, the problem of damaged copper lines becomes even more severe. The present invention teaches methods for avoiding the observed phenomenon of damaged copper lines.

The reliability of a metal interconnect is most commonly described by a lifetime experiment on a set of lines to obtain the medium time to failure. The stress experiment involves stressing the lines at high current densities and at elevated temperatures. The failure criterion is typically an electrical open for non-barrier conductors or a predetermined increase in line resistance for barrier metalization.

The mean time to failure is dependent on the line geometry where this failure is directly proportional to the line width and the line thickness. Experimentally, it has been shown that the width dependence is a function of the ratio of the grain size d of the film and the width of the conductor w. As the ratio w/d decreases, the mean time to failure will increase due to the bamboo effect.

U.S. Pat. No. 5,654,245 teaches about the problems encountered in depositing thin lines, particularly where these lines contain copper. It teaches that copper is notorious for (1) its poor adhesion qualities to silicon dioxide, (2) its tendency to readily diffuse through dielectric materials such as silicon dioxide under certain process conditions and contaminate an underlying silicon region, and (3) its resistance to traditional dry-etching patterning methods (RIE or plasma etch).

Conventional methods proposed for placing copper conductors on silicon based substrates are based on t he deposition of a variety of layers where each layer has characteristics of performance or deposition that enhance the use of copper as the major component within conducting lines. This approach has met with limited success and has as yet not resulted in the large-scale adaptation of copper. The present invention circumvents these disadvantages by teaching a method of copper line deposition that solves previous deposition problems by structural stress reducing approach.

U.S. Pat. No. 5,639,697 (Weling et al.) shows a method to form dummy lines, form an insulating layer thereover, and CMP. The dummy lines improve the CMP of the insulating layer.

U.S. Pat. No. 5,618,757 (Bothra et al.) shows a method to form dummy lines, form SOG and etch back SOG.

U.S. Pat. No. 5,770,518 (Shen) show a method to form dummy lines to reduce undercutting.

U.S. Pat. No. 5,633,190 (Sugiyama) and U.S. Pat. No. 4,916,514 (Nowak) show dummy lines to improve insulating layer chemical-mechanical polishing.

SUMMARY OF THE INVENTION

It is the primary objective of the invention to eliminate damascene copper lines that are damaged after planarization.

It is another objective of the invention to facilitate the creation of copper lines using the damascene process.

It is another objective of the invention to facilitate the creation of isolated copper lines or copper lines that are adjacent to open fields using the damascene process.

An isolated copper line is, within the scope of this invention, defined as a copper line where no other copper lines are present in the immediate physical vicinity of the isolated copper line. An isolated copper line is further defined as a copper line that is separated from adjacent copper lines by a distance in excess of at least 2.0 um.

A collection of copper lines is defined as a plurality of copper lines whereby each copper line within this collection of copper lines is in relatively close physical proximity to another copper line within this collection while the collection of copper lines itself is adjacent to an open field. A collection or dense array of copper lines is defined as a plurality of copper lines that are separated from each other by a distance of less than 1.0 micron.

In the first embodiment of the invention dummy copper lines are added to isolated copper lines or to selected copper lines within a collection of copper lines.

In the second embodiment of the invention copper end caps are added to isolated copper lines or to selected copper lines within a collection of copper lines.

In the third embodiment of the invention isolated copper lines or selected copper lines within a collection of copper lines are enlarged.

A line is typically considered an isolated line if the distance that separates the line from other lines is larger than 1 um. The distance between a separate line and the dummy lines is typically less than 100 um. The dummy line/end cap/enlargement is typically created for a collection of lines that is separated from a single line by a distance in excess of 100 um. The spacing between lines in a collection of lines is normally in excess of 10 um, the width of a cross section of a copper line is between about 0.4 and 1 um.

BRIEF DESCRIPTION OF THE DRAWINGS

FIG. 1 shows a Prior Art overview of the damascene process with the formation of a damascene plug.

FIG. 2 shows potential Prior Art problems encountered in depositing metal across a damascene surface.

FIG. 3 shows the implementation of the present invention of:

FIG. 3a shows the addition of dummy copper lines,

DESCRIPTION OF THE PREFERRED EMBODIMENT

Referring now specifically to FIG. 3a, there is shown a top view of copper lines 10, 12, 13, and 14. It is to be noted that copper line 10 is an isolated copper line, that is no other copper lines are present in the immediate vicinity of line 10. It must further be noted that copper lines 12, 13 and 14 form a collection of copper lines, each copper line within this collection of copper lines is in close physical proximity to another copper line within this collection while the collection of copper lines itself is adjacent to an open field 18. To the isolated copper line 10 two dummy copper lines 15 and 16 are added. These two added dummy lines 15 and 16 serve as spatial reinforcements to the surface of the isolated copper line 10. Prior Art surface damage to copper line 10 is thereby eliminated.

Copper lines 12, 13 and 14 are adjacent to the open field 18. The addition of the dummy copper line 17 buffers the transition between the three copper lines and the open field and, in so doing, eliminates the surface structural abrasion and with it the surface damage of Prior Art copper lines that are adjacent to open fields. The separation between the copper lines is typically in excess of 1 um. FIG. 3a further shows an X direction which is the longitudinal direction of the copper lines 10 and 12–18. Since these copper lines are created using a damascene process the X direction is also the direction of the damascene copper (or metal) wiring. The Y direction is perpendicular to the X direction and is therefore the direction that is perpendicular to the direction of the damascene metal wiring.

Figure 3B:
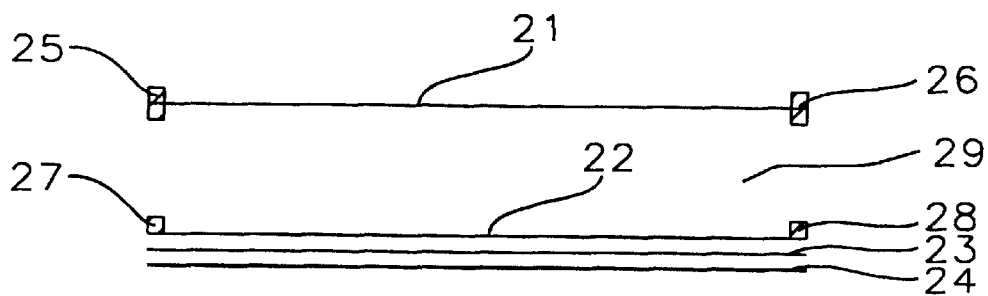
FIG. 3b shows end caps added to copper lines.

FIG. 3b shows an isolated copper line 21 and a set of three copper lines 22, 23 and 24. It must be noted that copper line 21 is an isolated copper line, that is no other copper lines are present in the immediate vicinity of line 21. It must further be noted that copper lines 22, 23 and 24 form a collection of copper lines, each copper line within this collection of copper lines is in close physical proximity to another copper line within this collection while the collection of copper lines itself is adjacent to an open field 29. To the isolated copper line 21 are added copper end pads 25 and 26, these end pads 25 and 26 reduce surface molecular irregularities and the subsequent lack of surface planarity thus eliminating Prior Art surface imperfections. The end caps are typically about 100×100 um in size.

To the end points of line 22, that is the line of the three line set that is closest to the open field 29, end pads 27 and 28 are added. These end pads 27 and 28 result in the same elimination of surface imperfections as previously indicated. Because lines 22, 23 and 24 are in close physical proximity, the reduction in surface imperfections and the subsequent surface improvements will propagate from line 22 into line 23 and 24 thereby improving the surface planarity of the entire set of three lines 22, 23 and 24.

Figure 3C:
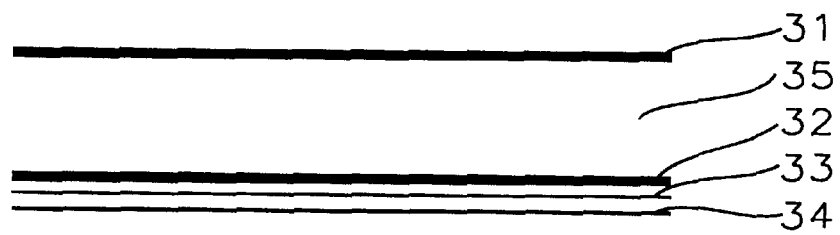
FIG. 3c shows the enlargement of copper lines.

FIG. 3c shows one isolated line 31 and a set of three lines 32, 33 and 34. It must be noted that copper line 31 is an isolated copper line, that is no other copper lines are present in the immediate vicinity of line 31. It must further be noted that copper lines 32, 33 and 34 form a collection of copper lines, each copper line within this collection of copper lines is in close physical proximity to another copper line within this collection while the collection of copper lines itself is adjacent to an open field 35. It will be noted that line 31 is of considerably more substantial construct whereby the top surface of this line is larger than, for instance, the top surface of line 21, FIG. 3b. This expansion of the top surface of line 31 results in a lessening of molecular irregularities on the top surface of the copper line 31 thereby eliminating lack of planarity of this top surface. It will further be noted that line 32 is also of considerably more substantial construct whereby the top surface of this line is larger than, for instance, the top surface of line 22, FIG. 3b. The same results as previously highlighted for copper line 31 will be obtained, in this instance these results will be extended to lines 33 and 34 in view of the close physical proximity between the lines 32, 33 and 34. This extension of the reduction in surface irregularities from line 32 to lines 33 and 34 will be more plausible if it is remembered that all three lines are formed with one step of copper deposition, at the time of the deposition therefore the lines will be inter-connected. Later steps of etching and planarization will separate the lines. At the time of line separation the sub-surface and internal molecular structure of the three lines has already been formed resulting in good planarization not only of line 32 but also of the adjacent lines 33 and 34.

Figure 3D:
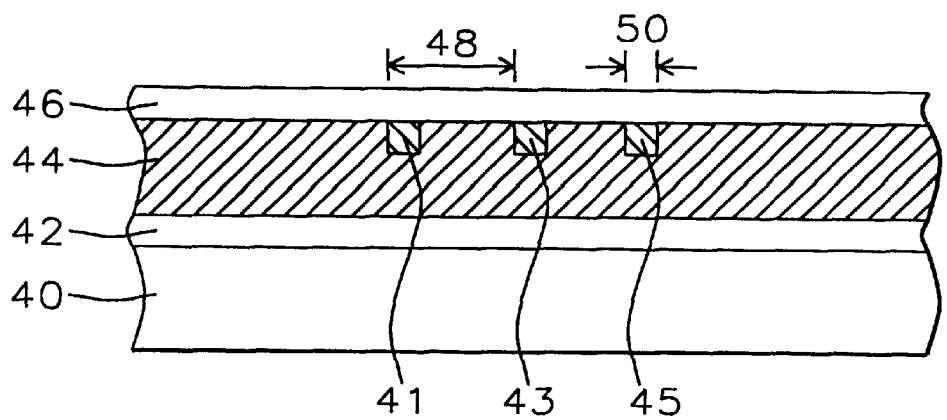
FIG. 3d shows a cross section of three copper lines formed using the damascene process, optional layers that can be deposited as part of the damascene process and dimensional parameters that relate to the copper lines.

FIG. 3d shows a cross section of a semiconductor substrate 40, this cross section is perpendicular to the (longitudinal) direction in which copper damascene interconnect lines have been created in a layer 44 of dielectric overlying the surface of substrate 40, that is the Y direction that is shown in FIG. 3a. On the surface of substrate 40 have been deposited:

- an (optional) base layer 42 such as a layer of pad oxide that can be deposited for stress release between the (underlying) substrate 40 and any overlying layers of semiconductor material
- a layer 44 of dielectric in which the (damascene) copper wires are formed
- an (optional) passivation layer 46 that can be deposited over the surface of the layer 44 of dielectric for the protection of the surface of layer 44 of dielectric in addition to the protection of features that have been created in the surface of layer 44
- interconnect lines 41, 43 and 45, these interconnect lines can be formed using the damascene process and, for the process of the invention, comprise copper; lines 41, 43 and 45 are adjacent copper wiring, no attempt has been made in FIG. 3d to further highlight line density between the adjacent lines
- parameter 48 is the distance (or adjacency) between adjacent lines 41 and 43
- the parameter 50 is the width of the top of the cross section of the damascene opening into which the copper wire 45 has been created.

It will be clear form the above description that any of the techniques used, although they have been described as individual and separate approaches, may readily be mixed and combined in order to establish optimum results of copper line planarity. Dummy lines can, for instance, be applied in combination and concurrent with copper line end pads or enlarged lines. The implementation of the invention can therefore leads to a number of combinations of the solutions within the scope of the invention that will result in eliminating copper line surface irregularities for a vast number of copper line and copper surface applications.

Although the particular embodiment of the present invention has been described in detail for purposes of illustration, modifications may be made without departing from the spirit and scope of the present invention. Accordingly, the invention is not to be limited except as by the appended claims.

What is claimed is:

1. A method of forming conducting lines within a damascene structure, consisting of:
   providing a semiconductor substrate;
   forming damascene metal plugs within said semiconductor substrate;
   depositing a layer of intra-level dielectric over said semiconductor substrate;
   patterning and etching said layer of intra-level dielectric, said patterning and etching said layer of intra-level dielectric creating a pattern of intra-dielectric openings, said openings being aligned with said damascene plugs, creating damascene metal wiring openings, further creating additional intra-level dielectric openings adjacent to said damascene metal wiring openings for created damascene metal wiring openings that have no adjacent damascene metal wiring openings as measured in a direction that is perpendicular to a longitudinal direction of said damascene metal wiring openings, no adjacency being determined by a lack of damascene metal wiring openings over a distance not exceeding twice a width at a top of a cross section of said damascene metal wire openings, said additional intra-level dielectric openings being created adjacent to said damascene metal wire openings, said adjacency being on one or both sides of said damascene metal wire openings;
   depositing a layer of metal over said patterned intra-level dielectric and over exposed surface of said semiconductor substrate; and
   planarizing said layer of metal, creating a damascene pattern.

2. The method of claim 1 wherein said damascene metal plug comprises copper or a copper alloy.

3. The method of claim 1 wherein said damascene metal plug comprises wolfram.

4. The method of claim 1 with the additional step of depositing a passivation layer over said created damascene pattern, said step occuring after said planarizing said layer of metal.

5. The method of claim 1 with the additional step of creating a base layer on the surface of said semiconductor substrate, said base layer being created prior to said depositing a layer of intra-level dielectric over said semiconductor substrate.

6. The method of claim 1 wherein said layer of metal comprises copper.

7. The method of claim 1 wherein said layer of metal comprises an aluminum/copper alloy.

8. A method of forming conducting lines within a damascene structure, consisting of:
   providing a semiconductor substrate;
   forming damascene metal plugs within said semiconductor substrate;
   depositing a layer of intra-level dielectric over said semiconductor substrate;
   patterning and etching said layer of intra-level dielectric, said patterning and etching said layer of intra-level dielectric creating a pattern of intra-dielectric openings, said openings aligning with said damascene plugs, creating damascene metal wiring openings, further creating additional intra-level dielectric openings as an extension of and being connected with said damascene metal wiring openings, said additional intra-level dielectric openings being created for created damascene metal wiring openings having no adjacent damascene metal wiring openings as measured in a direction that is perpendicular to a longitudinal direction of said damascene metal wiring openings, no adjacency being determined by a lack of damascene metal wiring openings over a distance not exceeding twice a width of a top of a cross section of said damascene metal wire openings, said additional intra-level dielectric openings being created at ends or extremities of said damascene metal wire openings, said additional intra-level dielectric openings further being created at an intersection of said damascene intra-level dielectric openings, a top view of a pattern of said damascene intra-dielectric openings having a pattern of intersecting lines intersecting under an angle, a top view of said additional intra-level dielectric openings having a design with a surface area exceeding in size the square of a width of a cross section of said metal wire openings by a measurable amount, further said additional intra-level dielectric openings being centered with and being part of said damascene intra-dielectric openings for damascene intra-dielectric openings lacking damascene metal wiring openings on both sides of said damascene intra-level dielectric openings, further said additional intra-level dielectric openings being adjacent to and attached to said damascene intra-dielectric openings for intra-dielectric openings lacking damascene metal wiring openings on one side of said damascene intra-level dielectric openings, said attachment occurring on a side of said intra-level dielectric opening lacking damascene metal wiring openings, said attachment between said intra-level dielectric opening and said additional intra-level dielectric openings being achieved while assuring maximum possible contact between said damascene intra-level dielectric opening and said additional intra-level dielectric openings;

depositing a layer of metal over said patterned intra-level dielectric and over exposed surface of said semiconductor substrate; and planarizing said layer of metal, creating a damascene pattern.

9. A method of forming conducting lines within a damascene structure, consisting of:

providing a semiconductor substrate;

forming damascene metal plugs within said semiconductor substrate;

depositing a layer of intra-level dielectric over said semiconductor substrate;

patterning and etching said layer of intra-level dielectric, said patterning and etching said layer of intra-level dielectric creating a pattern of intra-dielectric openings, said openings aligning with said damascene plugs, creating damascene metal wiring openings, further creating extra wide intra-level dielectric openings as a replacement for created damascene metal wiring openings having no adjacent damascene metal wiring openings as measured in a direction perpendicular to a longitudinal direction of said damascene metal wiring openings, no adjacency being measured as lacking damascene metal wiring openings over a distance not exceeding twice a width of a top of a cross section of said metal wire openings, said extra-wide intra-level dielectric openings having a cross section not less than twice a cross section of said intra-level dielectric openings;

depositing a layer of metal over said patterned intra-level dielectric and over exposed surface of said semiconductor substrate; and planarizing said layer of metal, creating a damascene pattern.

* * * * *